United States Patent
Tajima et al.

(10) Patent No.: US 9,647,109 B2
(45) Date of Patent: May 9, 2017

(54) SEMICONDUCTOR DEVICE

(71) Applicant: Kabushiki Kaisha Toshiba, Minato-ku, Tokyo (JP)

(72) Inventors: Hiroaki Tajima, Ota Tokyo (JP); Kazuaki Yamaura, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/060,810

(22) Filed: Mar. 4, 2016

(65) Prior Publication Data

US 2017/0069752 A1 Mar. 9, 2017

Related U.S. Application Data

(60) Provisional application No. 62/215,094, filed on Sep. 7, 2015.

(51) Int. Cl.
*H01L 29/778* (2006.01)
*H01L 29/78* (2006.01)
*H01L 29/10* (2006.01)
*H01L 29/08* (2006.01)

(52) U.S. Cl.
CPC ...... *H01L 29/7813* (2013.01); *H01L 29/0886* (2013.01); *H01L 29/1095* (2013.01)

(58) Field of Classification Search
CPC .. H01L 29/66712–29/66734; H01L 29/66674; H01L 29/7802–29/7815
USPC .............................................. 257/330, 331
See application file for complete search history.

(56) References Cited

U.S. PATENT DOCUMENTS

| | | | |
|---|---|---|---|
| 7,514,743 B2 * | 4/2009 | Yang | H01L 21/823487 257/328 |
| 7,655,974 B2 | 2/2010 | Shimada et al. | |
| 2005/0012114 A1 | 1/2005 | Tada et al. | |
| 2006/0267044 A1 * | 11/2006 | Yang | H01L 29/7823 257/141 |
| 2011/0127602 A1 * | 6/2011 | Mallikarjunaswamy | H01L 21/823807 257/331 |

FOREIGN PATENT DOCUMENTS

JP 2003-303964 A 10/2003
JP 2004-186463 A 7/2004

* cited by examiner

*Primary Examiner* — Jerome Jackson, Jr.
*Assistant Examiner* — Bo Fan
(74) *Attorney, Agent, or Firm* — White & Case LLP

(57) ABSTRACT

According to one embodiment, the fifth semiconductor region contacts the first semiconductor region. The metal region is provided on the fifth semiconductor region. The first insulating film extends in a thickness direction of the semiconductor layer. The first insulating film is adjacent to the fourth semiconductor region, the third semiconductor region, the second semiconductor region, and the first semiconductor region. The second insulating film extends in the thickness direction of the semiconductor layer. The second insulating film is provided between the fourth semiconductor region and the first conductive unit, between the third semiconductor region and the first conductive unit, and between the second semiconductor region and the first conductive unit.

20 Claims, 13 Drawing Sheets

US 9,647,109 B2

SEMICONDUCTOR DEVICE

CROSS-REFERENCE TO RELATED APPLICATION

This application is based upon and claims the benefit of priority from U.S. Provisional Patent Application 62/215,094, filed on Sep. 7, 2015; the entire contents of which are incorporated herein by reference.

FIELD

Embodiments described herein relate a semiconductor device.

BACKGROUND

A lateral drain-extended metal oxide semiconductor field effect transistor (LDMOS) has been proposed as a power device that is integrated together with an analog IC in one chip. As the required breakdown voltage increases, the element length of the LDMOS lengthens, and the chip size increases.

DETAILED DESCRIPTION

Figure 1:
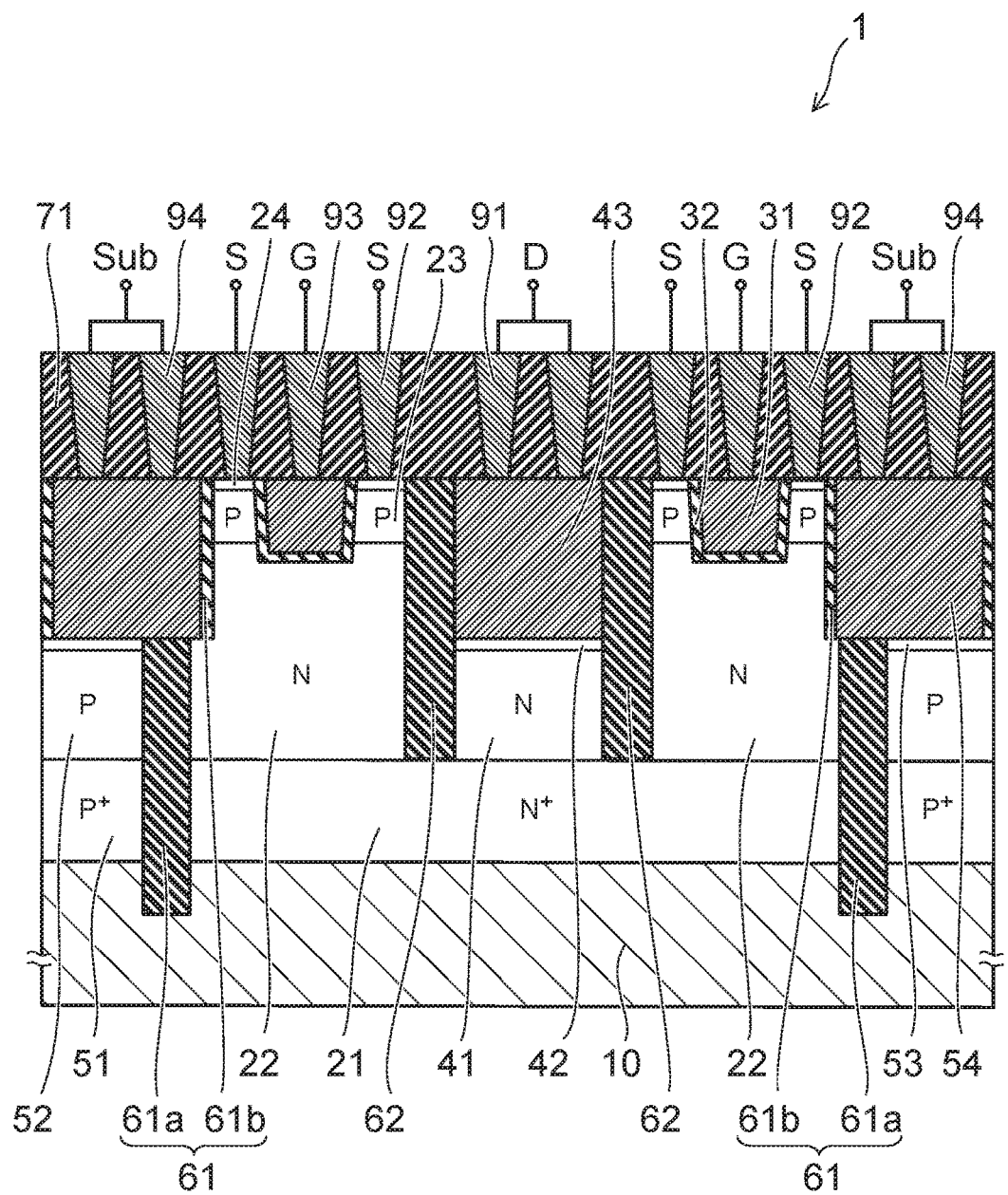
FIGS. 1 to 5 are schematic cross-sectional views of a semiconductor device of a first embodiment.

According to one embodiment, a semiconductor device includes a semiconductor layer, a first conductive unit, a first insulating film, a second insulating film, a gate electrode, and a gate insulator film. The semiconductor layer is provided on a substrate. The semiconductor layer includes a first semiconductor region of a first conductivity type, a second semiconductor region of the first conductivity type, a third semiconductor region of a second conductivity type, and a fourth semiconductor region of the first conductivity type. The first semiconductor region is provided on the substrate. The second semiconductor region is provided on the first semiconductor region. A first conductivity-type impurity concentration is lower in the second semiconductor region than in the first semiconductor region. The third semiconductor region is provided on the second semiconductor region. The fourth semiconductor region is provided in a surface of the third semiconductor region. The first conductive unit is provided on the first semiconductor region. The first conductive unit includes a fifth semiconductor region and a metal region. The fifth semiconductor region contacts the first semiconductor region. The metal region is provided on the fifth semiconductor region. The first insulating film extends in a thickness direction of the semiconductor layer from a surface of the fourth semiconductor region to the substrate. The first insulating film is adjacent to the fourth semiconductor region, the third semiconductor region, the second semiconductor region, and the first semiconductor region. The second insulating film extends in the thickness direction of the semiconductor layer from the surface of the fourth semiconductor region to the first semiconductor region. The second insulating film is provided between the fourth semiconductor region and the first conductive unit, between the third semiconductor region and the first conductive unit, and between the second semiconductor region and the first conductive unit. The gate electrode is placed at an opposite side of the third semiconductor region. The gate insulator film is provided between the third semiconductor region and the gate electrode.

Embodiments will now be described with reference to the drawings. The same components in the drawings are marked with the same reference numerals.

For example, the semiconductor device of the embodiments has a configuration in which an analog IC and a power device are formed on the same substrate and provided together in one chip. In the embodiments recited below, a vertical drain-extended metal oxide semiconductor field effect transistor (VDMOS) is described as an example of the power device.

In the VDMOS, a current flows along the thickness direction of a semiconductor layer provided on a substrate (the vertical direction intersecting a major surface of the substrate) from a drain region to a source region via a drift region and a channel.

Although the first conductivity type is described as an N-type and the second conductivity type is described as a P-type in the embodiments recited below, the embodiments also are implementable in the case where the first conductivity type is the P-type and the second conductivity type is the N-type.

Also, although silicon is illustrated in the embodiments recited below as the material of the substrate, the semiconductor layers, and the semiconductor regions, the material of the substrate, the semiconductor layers, and the semiconductor regions may be silicon carbide, gallium nitride, gallium oxide, diamond, etc. A substrate may be a heavily doped P-type silicon substrate having multiple epitaxial layers. A semiconductor layer may include a silicon on insulator (SOI).

Also, in the embodiments recited below, the impurity concentration can be replaced and read as the carrier concentration. The carrier concentration can be considered to be the effective impurity concentration.

FIG. 1 is a schematic cross-sectional view of a VDMOS 1 of a first embodiment.

A semiconductor layer is provided on a substrate 10 or semiconductor region. The conductivity type of the substrate 10 is, for example, the P-type.

For example, a gate electrode 31 having a trench gate structure is provided in the semiconductor layer with a gate insulator film 32 interposed. Also, for example, insulating films 61 and 62 that have deep trench isolation (DTI) structures are provided in the semiconductor layer.

The semiconductor layer includes a drain region (a first semiconductor region) 21, a drift region (a second semiconductor region) 22, a body region (a third semiconductor region) 23, a source region (a fourth semiconductor region) 24, a drain draw-out region (a fifth semiconductor region) 41, a contact region 42, substrate draw-out regions (sixth semiconductor regions) 51 and 52, and a contact region 53.

The N-type drain region 21 is provided on the substrate 10; and the N-type drift region 22 is provided on the drain region 21. The drain region 21 and the substrate 10 have a P-N junction. The N-type impurity concentration of the drift region 22 is lower than the N-type impurity concentration of the drain region 21.

The P-type body region (or base region) 23 is provided on the drift region 22. The N-type source region 24 is provided in the front surface of the body region 23. The N-type impurity concentration of the source region 24 is higher than the N-type impurity concentration of the drift region 22.

The trench-gate type gate electrode 31 is provided from the front surface of the semiconductor layer to a depth that reaches the drift region 22. The side surface of the gate electrode 31 opposes, with the gate insulator film 32 interposed, the source region 24 and the body region 23.

The gate insulator film 32 is provided between the source region 24 and the gate electrode 31 and between the body region 23 and the gate electrode 31. Also, the gate insulator film 32 is provided between the drift region 22 and the bottom of the gate electrode 31.

The drain draw-out region 41 is provided on the drain region 21 in contact with the drain region 21. In the VDMOS 1 shown in FIG. 1, the drain draw-out region 41 is the N-type. A metal region 43 is provided on the drain draw-out region 41 with the N-type contact region 42 interposed. The N-type impurity concentration of the contact region 42 is higher than the N-type impurity concentration of the drain draw-out region 41. The drain draw-out region 41 has an ohmic contact with the metal region 43 via the contact region 42.

The drain draw-out region 41, the contact region 42, and the metal region 43 function as a conductive unit for drain draw-out to connect the drain region 21 to a drain terminal D.

The insulating film 62 is provided between the source region 24 and the conductive unit for drain draw-out, between the body region 23 and the conductive unit for drain draw-out, and between the drift region 22 and the conductive unit for drain draw-out.

The insulating film 62 extends in the thickness direction of the semiconductor layer from the front surface of the semiconductor layer and reaches the drain region 21. The insulating film 62 does not reach the substrate 10 under the drain region 21.

The insulating film 62 extends into the page surface and separates the source region 24 from the conductive unit for drain draw-out, the body region 23 from the conductive unit for drain draw-out, and the drift region 22 from the conductive unit for drain draw-out.

The source region 24, the body region 23, and the drift region 22 are adjacent to one side surface of the insulating film 62.

The metal region 43, the contact region 42, and the drain draw-out region 41 of the conductive unit for drain draw-out are adjacent to another side surface of the insulating film 62.

The width of the insulating film 62 is narrower than the width of the metal region 43.

The substrate draw-out region 51 that is of the same P-type as the substrate 10 is provided in the same layer as the drain region 21 on the substrate 10. The P-type substrate draw-out region 52 is provided on the substrate draw-out region 51; and a metal region 54 is provided on the substrate draw-out region 52 with the P-type contact region 53 interposed. The P-type impurity concentrations of the substrate draw-out region 51 and the contact region 53 are higher than the P-type impurity concentration of the substrate draw-out region 52. The substrate draw-out regions 51 and 52 have ohmic contacts with the metal region 54 via the contact region 53.

The substrate draw-out regions 51 and 52, the contact region 53, and the metal region 54 function as a conductive unit for substrate draw-out to connect the substrate 10 to a substrate terminal Sub.

The insulating film 61 is provided between the source region 24 and the conductive unit for substrate draw-out, between the body region 23 and the conductive unit for substrate draw-out, between the drift region 22 and the conductive unit for substrate draw-out, and between the drain region 21 and the conductive unit for substrate draw-out. The insulating film 61 extends in the thickness direction of the semiconductor layer from the front surface of the semiconductor layer and reaches the substrate 10.

The insulating film 61 includes a first portion 61a that extends in the thickness direction of the semiconductor layer from the lower surface of the metal region 54 and reaches the substrate 10, and a second portion 61b that is provided at the side surface of the metal region 54.

The first portion 61a extends into the page surface and separates the contact region 53 from the drift region 22, the substrate draw-out region 52 from the drift region 22, and the substrate draw-out region 51 from the drain region 21.

The second portion 61b of the insulating film 61 extends into the page surface and separates the metal region 54 from the source region 24, the metal region 54 from the body region 23, and the metal region 54 from the drift region 22.

The width of the first portion 61a is wider than the width of the second portion 61b. The width of the metal region 54 is wider than the width of the first portion 61a.

The insulating film 61 is an element separation film that separates the VDMOS 1 from other elements (including other VDMOSs). The VDMOS 1 is provided in a region separated by multiple insulating films 61 or in a region surrounded with the insulating film 61.

For example, the VDMOS 1 is separated from the other elements in a direction along the major surface of the substrate 10 by the multiple insulating films 61 extending in stripe configurations. Or, the insulating film 61 is formed continuously in a ring-shaped planar pattern that surrounds the region where the VDMOS 1 is formed.

The insulating film 62 is provided inside the element and separates the drain side and the source side. The insulating film 62 and the first portion 61a of the insulating film 61 are formed in the same process and have substantially the same width and same length. Here, the "length" refers to the length or depth in the thickness direction of the semiconductor layer.

The first portion 61a and the second portion 61b of the insulating film 61 and the insulating film 62 are, for example, silicon oxide films.

The metal region 43 for drain draw-out and the metal region 54 for substrate draw-out are formed in the same process and have substantially the same width and same length. Here, the "length" refers to the length or depth in the thickness direction of the semiconductor layer.

The metal regions 43 and 54 have structures in which metals (including metal nitrides) are filled, with barrier metals interposed, into trenches made in the front surface of the semiconductor layer. For example, aluminum, copper, tungsten, tantalum, tantalum nitride, titanium, and titanium nitride are examples of the metal that is included in the metal regions 43 and 54. Also, for example, titanium nitride and tantalum nitride are examples of the barrier metals.

An insulating layer 71 is provided on the front surface of the semiconductor layer; and contacts that are described below for electrically connecting the components described above to an external circuit are provided to pierce the insulating layer 71. The contacts are formed of a metal material.

A source contact 92 is provided on the source region 24. The source region 24 has an ohmic contact with the source contact 92 directly or via a metal silicide. The source contact 92 is connected to a source terminal S via a not-shown source electrode and/or source interconnect.

A gate contact 93 is provided on the gate electrode 31. The gate electrode 31 has an ohmic contact with the gate contact 93 directly or via a metal silicide. The gate contact 93 is connected to a gate terminal G via a not-shown gate interconnect.

A drain contact 91 is provided on the metal region 43 for drain draw-out in contact with the metal region 43. The drain contact 91 is connected to the drain terminal D via a not-shown drain electrode and/or drain interconnect.

A substrate contact 94 is provided on the metal region 54 for substrate draw-out in contact with the metal region 54. The substrate contact 94 is connected to the substrate terminal Sub via a not-shown interconnect.

A drain potential is applied to the drain region 21 from the drain terminal D via the drain contact 91, the metal region 43, the contact region 42, and the drain draw-out region 41. A source potential is applied from the source terminal S via the source contact 92. A gate potential is applied from the gate terminal G via the gate contact 93.

In the ON operation of the VDMOS 1, a drain potential (e.g., a positive potential) that is higher than the source potential is applied to the drain region 21; and a source potential (e.g., a ground potential) that is lower than the drain potential is applied to the source region 24. Then, when a positive gate potential is applied to the gate electrode 31, a channel (an inversion layer) is formed in the region of the body region 23 opposing the gate electrode 31 with the gate insulator film 32 interposed; and a current flows from the drain terminal D to the source terminal S via the drain region 21, the drift region 22, the channel, and the source region 24.

The drift region 22 that has an N-type impurity concentration that is lower than that of the drain region 21 bears the breakdown voltage of the VDMOS 1. In other words, a depletion layer extends from the P-N junction between the body region 23 and the drift region 22 when OFF, that is, when, for example, the ground potential is applied to the gate electrode 31.

For example, the ground potential is applied to the substrate 10 from the substrate terminal Sub via the substrate contact 94, the metal region 54, the contact region 53, and the substrate draw-out regions 52 and 51. Accordingly, a reverse bias is applied to the P-N junction between the substrate 10 and the drain region 21; the VDMOS 1 is electrically isolated from the substrate 10; and a current does not flow via the substrate 10 between the VDMOS 1 and the other elements.

In a vertical MOS, the source region and the drain region have a stacked arrangement with a body region interposed in the thickness direction (the vertical direction) of the semiconductor layer. Also, in the VDMOS that is provided together with other elements such as an analog IC, etc., on the substrate 10, the drain electrode cannot be formed on the backside of the substrate 10. Therefore, a structure for drawing out the drain region 21 above the front surface of the semiconductor layer is necessary.

According to the embodiment, the conductive unit that includes the semiconductor regions 41 and 42 and the metal region 43 for drain draw-out is provided inside the element region on the inner side of the insulating film 61 for element separation. The source region 24 and the conductive unit for drain draw-out are adjacent to each other with the insulating film 62 having a DTI structure interposed. Accordingly, the increase of the horizontal-direction size of the DMOS element is suppressed; and it is possible to reduce the size of the entire chip. The insulation between the drain side and the source side above the drain region 21 is performed by the insulating film 62.

Although the insulating film 61 for element separation reaches the substrate 10 through the drain region 21, the inner-element insulating film 62 for source-drain separation does not divide the drain region 21. Accordingly, the current path via the drain region 21 between the drift region 22 and the conductive unit for drain draw-out is not divided.

Figure 2:
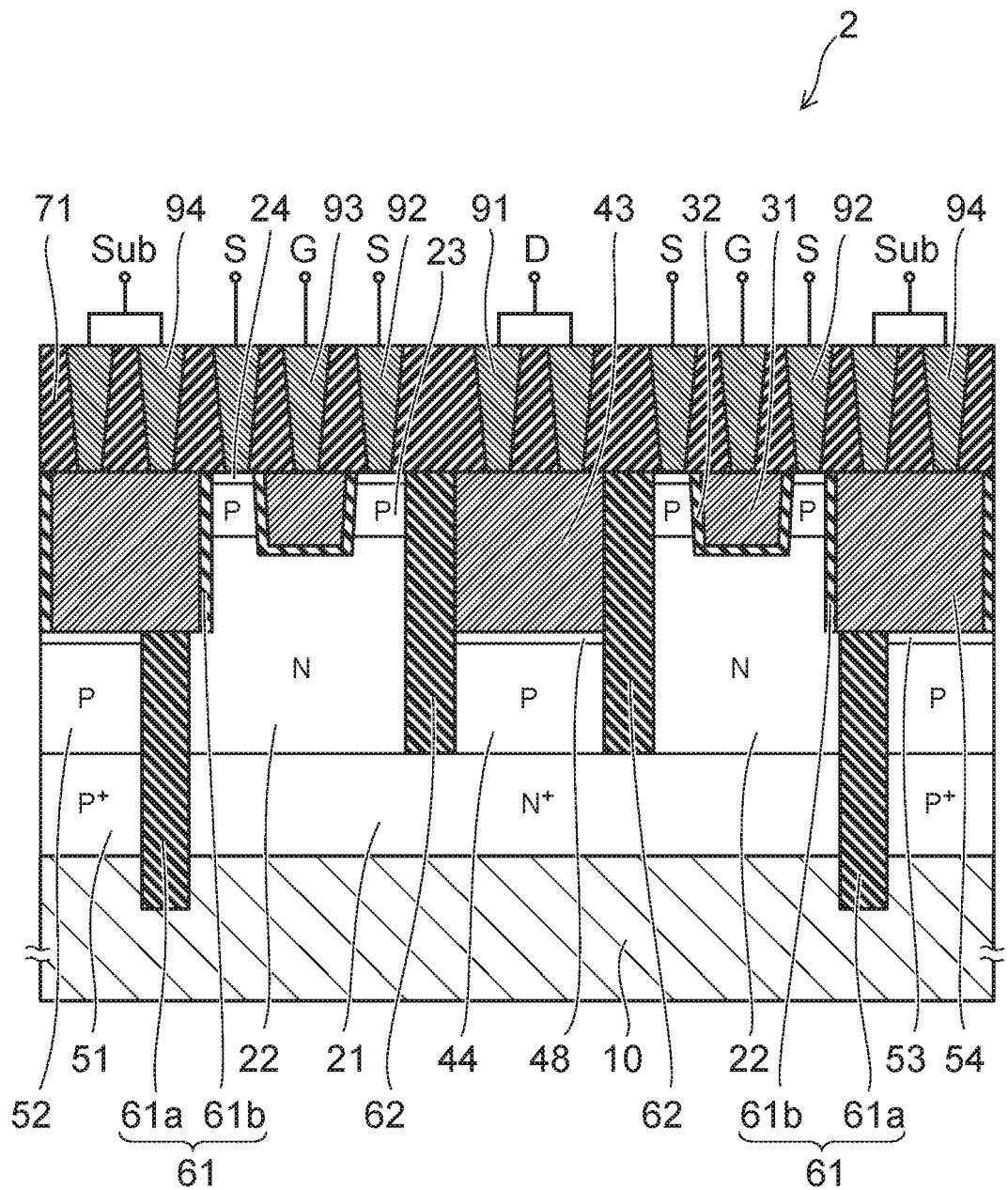

FIG. 2 is a schematic cross-sectional view of a VDMOS 2 which is another specific example of the semiconductor device of the first embodiment.

The VDMOS 2 is formed on the same substrate 10 with the VDMOS 1 shown in FIG. 1; and the VDMOS 1 (the first element) and the VDMOS 2 (the second element) are provided together in one chip.

Semiconductor regions 48 and 44 under the metal region 43 of the conductive unit for drain draw-out of the VDMOS 2 is of the P-type which is the reverse conductivity type of that of the VDMOS 1 shown in FIG. 1. The other components of the VDMOS 2 are the same as those of the VDMOS 1; and a description thereof is omitted.

In other words, the P-type drain draw-out region 44 is provided on the drain region 21 in contact with the drain region 21. The metal region 43 is provided on the drain draw-out region 44 with the P-type contact region 48 interposed. The P-type impurity concentration of the contact region 48 is higher than the P-type impurity concentration of the drain draw-out region 44. The drain draw-out region 44 has an ohmic contact with the metal region 43 via the contact region 48.

The drain draw-out region 44, the contact region 48, and the metal region 43 function as a conductive unit connecting the drain region 21 to the drain contact 91. In other words, a potential is applied to the drain region 21 from the drain terminal D via the drain contact 91 and the conductive unit for drain draw-out (the drain draw-out region 44, the contact region 48, and the metal region 43).

The VDMOS 2 shown in FIG. 2 has a negative input breakdown voltage when a negative potential is input to the drain terminal D in, for example, the OFF state in which the ground potential is applied to the gate electrode 31. The negative potential that is input to the drain terminal D is applied to the P-type drain draw-out region 44 via the drain contact 91, the metal region 43, and the contact region 48.

Because the substrate 10, the source region 24, and the gate electrode 31 are set to the ground potential, the drain region 21 that is surrounded with the substrate 10, the source region 24, and the gate electrode 31 also is set to the ground potential.

Accordingly, the negative input breakdown voltage is ensured by a reverse bias being applied to the P-N junction between the drain draw-out region 44 and the drain region 21 and by a depletion layer extending from the P-N junction.

The VDMOS 1 shown in FIG. 1 and the VDMOS 2 shown in FIG. 2 are formed in the same process on the same substrate 10 and can be provided together in one chip. By selecting the impurity implanted into the semiconductor region of the drain draw-out conductive unit contacting the drain region 21, the VDMOS 1 that includes the N-type drain draw-out region 41 and the VDMOS 2 that includes the P-type drain draw-out region 44 can easily be made individually.

In other words, according to the first embodiment, by using the impurity-doped semiconductor region as the portion of the conductive unit for drain draw-out on the side contacting the drain region 21 instead of making the entire conductive unit for drain draw-out as a metal region, the VDMOS 1 that is normal and the VDMOS 2 that has the negative input breakdown voltage can be integrated together easily in one chip.

Figure 3:
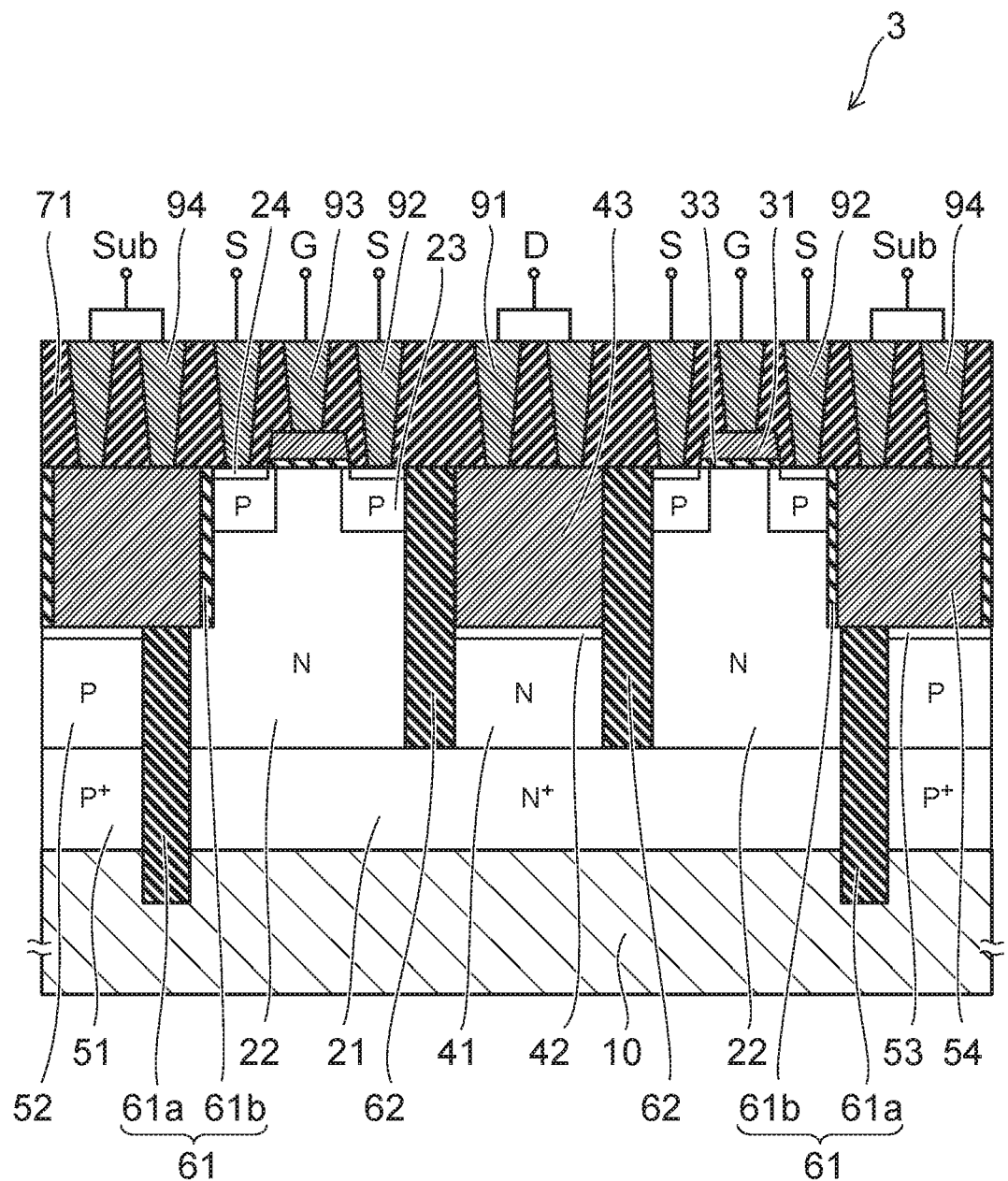

FIG. 3 is a schematic cross-sectional view of a VDMOS 3 which is yet another specific example of the semiconductor device of the first embodiment.

The VDMOS 3 of FIG. 3 has not a trench gate structure but a planar gate structure provided on the front surface of the semiconductor layer.

The body region 23 is formed in the front surface of the drift region 22; and the source region 24 is formed in the front surface of the body region 23. The body region 23 includes a region interposed between the source region 24 and the drift region 22 in the horizontal direction. The gate electrode 31 is provided on the region with a gate insulator film 33 interposed. The other components are the same as those of the VDMOS 1 of FIG. 1.

Also, in the VDMOS 3 having the planar gate structure of FIG. 3, the N-type drain draw-out region 41 can be replaced with the P-type drain draw-out region 44 shown in FIG. 2 to provide a VDMOS having a negative input breakdown voltage. The VDMOS that has the negative input breakdown voltage and the VDMOS 3 of FIG. 3 can be formed on the same substrate 10 and can be provided together in one chip.

Figure 4:
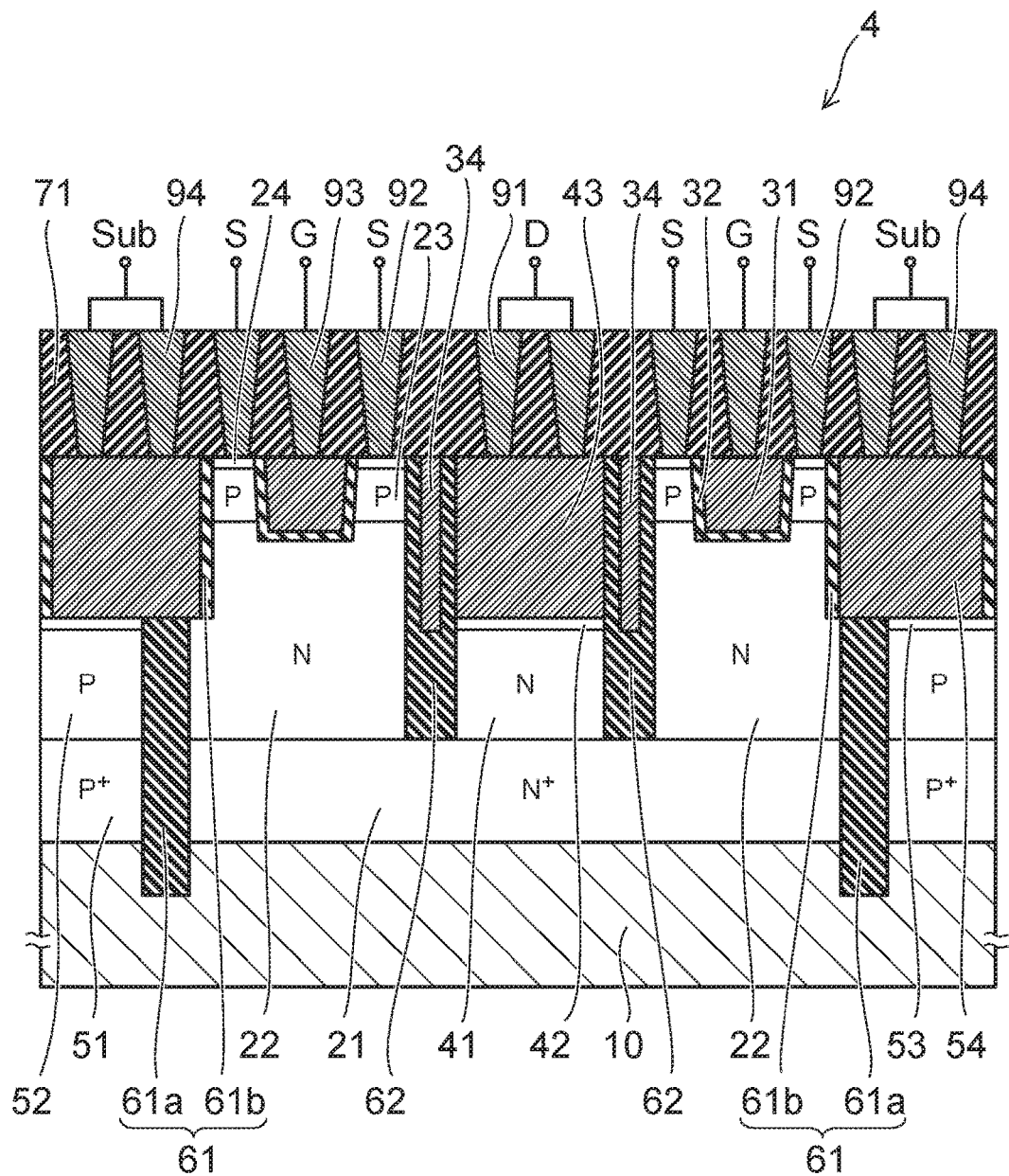

FIG. 4 is a schematic cross-sectional view of a VDMOS 4 of yet another specific example of the semiconductor device of the first embodiment.

The VDMOS 4 includes a field plate electrode 34 filled into the insulating film 62 that separates the source side and the drain side inside the element. The other components are the same as those of the VDMOS 1 shown in FIG. 1.

The field plate electrode 34 extends in the thickness direction of the semiconductor layer through the insulating film 62 from the upper surface of the insulating film 62. For example, the field plate electrode 34 extends into the page surface similarly to the source region 24, the body region 23, the drift region 22, and the insulating film 62.

A portion of the insulating film 62 is provided between the field plate electrode 34 and the source region 24, between the field plate electrode 34 and the body region 23, and between the field plate electrode 34 and the drift region 22.

A portion of the insulating film 62 is provided between the field plate electrode 34 and the metal region 43 for drain draw-out.

For example, the field plate electrode 34 is formed of the same material as the gate electrode 31. The field plate electrode 34 includes, for example, polycrystalline silicon.

The field plate electrode 34 is shorted to the gate terminal G or the source terminal S. Accordingly, when OFF, for example, the ground potential is applied to the field plate electrode 34. Because the field plate electrode 34 opposes, with a portion of the insulating film 62 interposed, the P-N junction between the body region 23 and the drift region 22, the electric field that is applied to the P-N junction between the body region 23 and the drift region 22 when OFF is relaxed; and the breakdown voltage can be increased.

The field plate electrode 34 may be provided inside the insulating film 62 in the VDMOSs 1 to 3 shown in FIG. 1 to FIG. 3 as well.

Figure 5:
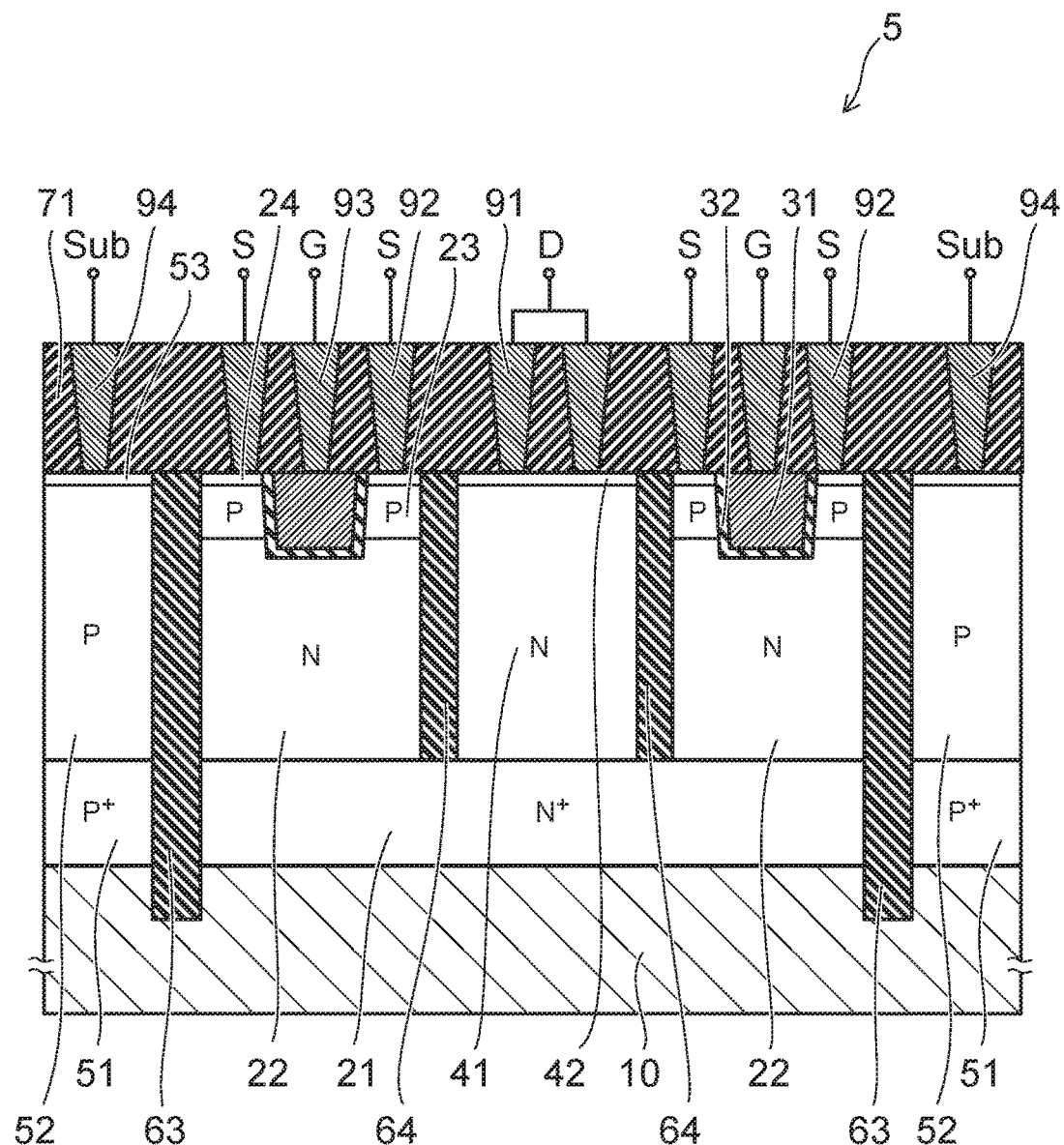

FIG. 5 is a schematic cross-sectional view of a VDMOS 5 of yet another specific example of the semiconductor device of the first embodiment.

The VDMOS 5 includes an insulating film 63 as a component corresponding to the insulating film 61 of the VDMOS 1 shown in FIG. 1 and includes an insulating film 64 as a component corresponding to the insulating film 62 of the VDMOS 1 shown in FIG. 1.

The insulating film 63 extends in the thickness direction of the semiconductor layer and extends into the page surface from the front surface of the semiconductor layer to reach the substrate 10.

The regions 51 to 53 of the conductive unit for substrate draw-out are adjacent to one side surface of the insulating film 63.

The source region 24, the body region 23, the drift region 22, and the drain region 21 are adjacent to another side surface of the insulating film 63.

The VDMOS 5 is provided in a region separated by multiple insulating films 63 or in a region surrounded with the insulating film 63 formed continuously in a ring-shaped planar pattern.

The P-type substrate draw-out region 51 is provided on the substrate 10 in a region on the outer side of the insulating film 63; the P-type substrate draw-out region 52 is provided on the substrate draw-out region 51; and the P-type contact region 53 is provided on the substrate draw-out region 52. The contact region 53 contacts the substrate contact 94 directly or via a metal silicide. The P-type impurity concentrations of the substrate draw-out region 51 and the contact region 53 are higher than the P-type impurity concentration of the substrate draw-out region 52.

The insulating film 64 is provided inside the element and separates the source side and the drain side above the drain region 21.

The insulating film 64 extends in the thickness direction of the semiconductor layer and extends into the page surface from the front surface of the semiconductor layer to reach the drain region 21. The insulating film 64 does not reach the substrate 10; and the drain region 21 is not divided.

The insulating film 64 is provided between the source region 24 and the conductive unit for drain draw-out including the contact region 42 and the drain draw-out region 41, between the body region 23 and the conductive unit for drain draw-out, and between the drift region 22 and the conductive unit for drain draw-out.

As described below, the insulating film 63 and the insulating film 64 have DTI structures in which insulating films (e.g., silicon oxide films) are filled into trenches made in the semiconductor layer simultaneously by RIE.

The width of the insulating film 63 is wider than the width of the insulating film 64. The length of the insulating film 63 is longer than the length of the insulating film 64. Here, the length refers to the length in the thickness direction of the semiconductor layer.

In the VDMOS 5 of FIG. 5 as well, similarly to the VDMOS 1 shown in FIG. 1, the reduction of the element size is realized by providing the conductive unit for drain draw-out to be adjacent, with the insulating film 64 interposed, to the source region 24, the body region 23, and the drift region 22.

For example, the drain region 21 of the VDMOS 5 of FIG. 5 is connected to the drain contact 91 via the N-type semiconductor regions (the drain draw-out region 41 and the contact region 42).

The drain draw-out region 41 is provided on the drain region 21 in contact with the drain region 21. The N-type impurity concentration of the contact region 42 is higher than the N-type impurity concentration of the drain draw-out region 41. The contact region 42 is connected to the drain contact 91 directly or via a metal silicide.

Or, the conductive unit for drain draw-out of the VDMOS 5 of FIG. 5 may include the metal region 43 as in the VDMOS 1 of FIG. 1. In the case of such a structure, a negative input breakdown voltage can be provided by replacing the N-type drain draw-out region 41 with the P-type drain draw-out region 44 as in the VDMOS 2 shown in FIG. 2. Also, the VDMOS 5 that is normal and the VDMOS that has the negative input breakdown voltage can be integrated together easily in one chip by using an impurity-doped semiconductor region instead of a metal region as the portion of the conductive unit for drain draw-out on the side contacting the drain region 21.

Also, the VDMOS 5 shown in FIG. 5 can have a planar gate structure as in the VDMOS 3 shown in FIG. 3.

Also, the VDMOS 5 shown in FIG. 5 can include the field plate electrode 34 provided inside the insulating film 64 as in the VDMOS 4 shown in FIG. 4.

Figure 6:
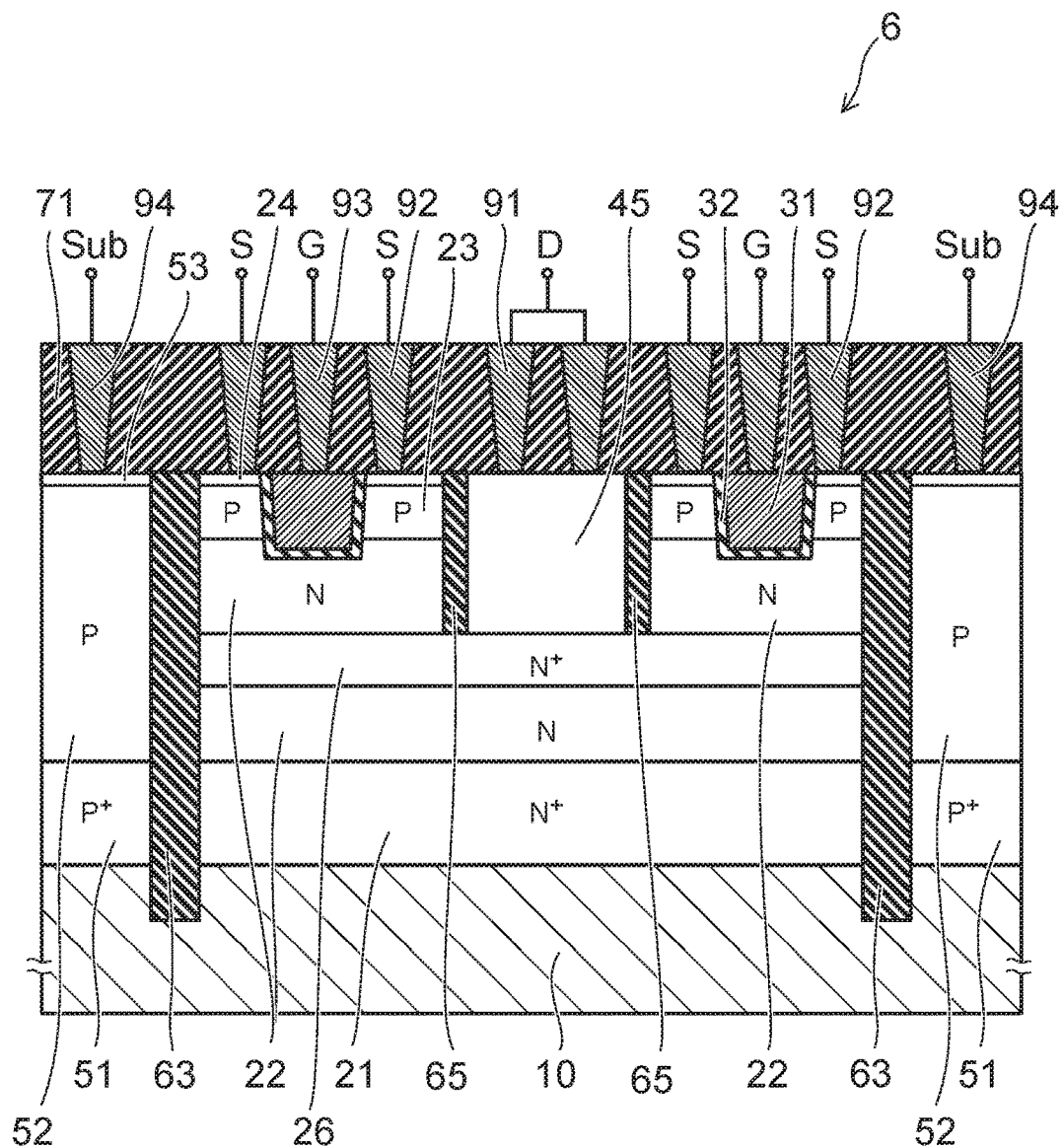
FIGS. 6 and 7 are schematic cross-sectional views of a semiconductor device of a second embodiment.

FIG. 6 is a schematic cross-sectional view of a VDMOS 6 of a semiconductor device of a second embodiment.

In the VDMOSs of FIG. 1 to FIG. 5, an N$^+$-type semiconductor region that is provided on the substrate 10 in contact with the substrate 10 functions as the drain region 21.

In the VDMOS 6 of FIG. 6 as well, the N$^+$-type semiconductor region 21 is provided on the substrate 10 in contact with the substrate 10. Further, in the VDMOS 6, an N$^+$-type drain region 26 is provided above the N$^+$-type semiconductor region 21.

The drain region 26 is provided inside the drift region 22 to be separated from the N$^+$-type semiconductor region 21. The N-type impurity concentration of the drain region 26 is higher than the N-type impurity concentration of the drift region 22.

In the VDMOS 6 of FIG. 6, the insulating film 63 for element separation similar to that of the VDMOS 5 shown in FIG. 5 described above is provided.

In a region on the inner side of the insulating film 63, the drift region 22 is divided above and below by the drain region 26. Of the upper and lower drift regions 22, the drift region 22 that is above the drain region 26 is used as a current path between the drain and source when ON.

The body region 23 is provided on the drift region 22; and the source region 24 is provided in the front surface of the body region 23.

A conductive unit 45 for drain draw-out is provided on the drain region 26; and the conductive unit 45 for drain draw-out contacts the drain contact 91.

The conductive unit 45 for drain draw-out is a metal region, is an impurity-doped semiconductor region, or has a stacked structure of a metal region and an impurity-doped semiconductor region.

In the VDMOS 6 of FIG. 6, the conductive unit 45 for drain draw-out is separated from the source side by an insulating film 65.

The insulating film 65 extends in the thickness direction of the semiconductor layer and extends into the page surface from the front surface of the semiconductor layer to reach the drain region 26. The insulating film 65 does not divide the drain region 26.

The insulating film 65 is provided between the source region 24 and the conductive unit 45 for drain draw-out, between the body region 23 and the conductive unit 45 for drain draw-out, and between the drift region 22 and the conductive unit 45 for drain draw-out.

In the VDMOS 6 of FIG. 6 as well, the reduction of the element size is realized by providing the conductive unit 45 for drain draw-out similarly to the embodiment recited above to be adjacent, with the insulating film 65 interposed, to the source region 24, the body region 23, and the drift region 22.

Also, the VDMOS 6 shown in FIG. 6 can have a planar gate structure as in the VDMOS 3 shown in FIG. 3.

Also, the VDMOS 6 shown in FIG. 6 can include the field plate electrode 34 provided inside the insulating film 65 as in the VDMOS 4 shown in FIG. 4.

When comparing for the same impurity concentration of the drift region 22, an element that has a long drift length (the thickness in the vertical direction of the drift region 22) has a higher breakdown voltage than an element that has a short drift length.

The drift lengths of the VDMOSs shown in FIG. 1 to FIG. 5 correspond to the distance between the N$^+$-type semiconductor region 21 and the body region 23 in the VDMOS 6 shown in FIG. 6.

Conversely, the drift length of the VDMOS 6 of FIG. 6 is the distance between the drain region 26 and the body region 23 and is shorter than the drift lengths of the VDMOSs shown in FIG. 1 to FIG. 5. In other words, the VDMOS 6 of FIG. 6 is an element having a lower breakdown voltage than the VDMOSs shown in FIG. 1 to FIG. 5. The ON resistance is lower for an element having a short drift length than for an element having a long drift length. In other words, compared to the VDMOSs shown in FIG. 1 to FIG. 5, the VDMOS 6 of FIG. 6 is designed with more priority on the reduction of the ON resistance than on the breakdown voltage.

The low breakdown voltage VDMOS 6 of FIG. 6 is formed on the same substrate 10 as any of the high breakdown voltage VDMOSs shown in FIG. 1 to FIG. 5; and the low breakdown voltage VDMOS 6 and the high breakdown voltage VDMOS are provided together in one chip.

The low breakdown voltage VDMOS 6 can be formed by adding, to the structure of the high breakdown voltage VDMOS, only the process of forming the N$^+$-type drain region 26 inside the drift region 22.

For example, in the case where the high breakdown voltage VDMOS 5 shown in FIG. 5 and the low breakdown voltage VDMOS 6 shown in FIG. 6 are provided together, the insulating film 64 of the high breakdown voltage VDMOS 5 and the insulating film 65 of the low breakdown voltage VDMOS 6 can be formed simultaneously in the same process.

The width of the insulating film 65 of the low breakdown voltage VDMOS 6 is narrower than the width of the insulating film 64 of the high breakdown voltage VDMOS 5. The length of the insulating film 65 of the low breakdown voltage VDMOS 6 is shorter than the length of the insulating film 64 of the high breakdown voltage VDMOS 5. Here, the length refers to the length in the thickness direction of the semiconductor layer.

The insulating film 64 and the insulating film 65 have DTI structures in which insulating films are filled into trenches made in the semiconductor layer.

As described below, trenches having different depths can be made simultaneously by making, simultaneously by RIE, a trench having a wide width for forming the insulating film 64 and a trench having a narrow width for forming the insulating film 65 because the etching progresses quickly for the trench having the wide width.

Figure 7:
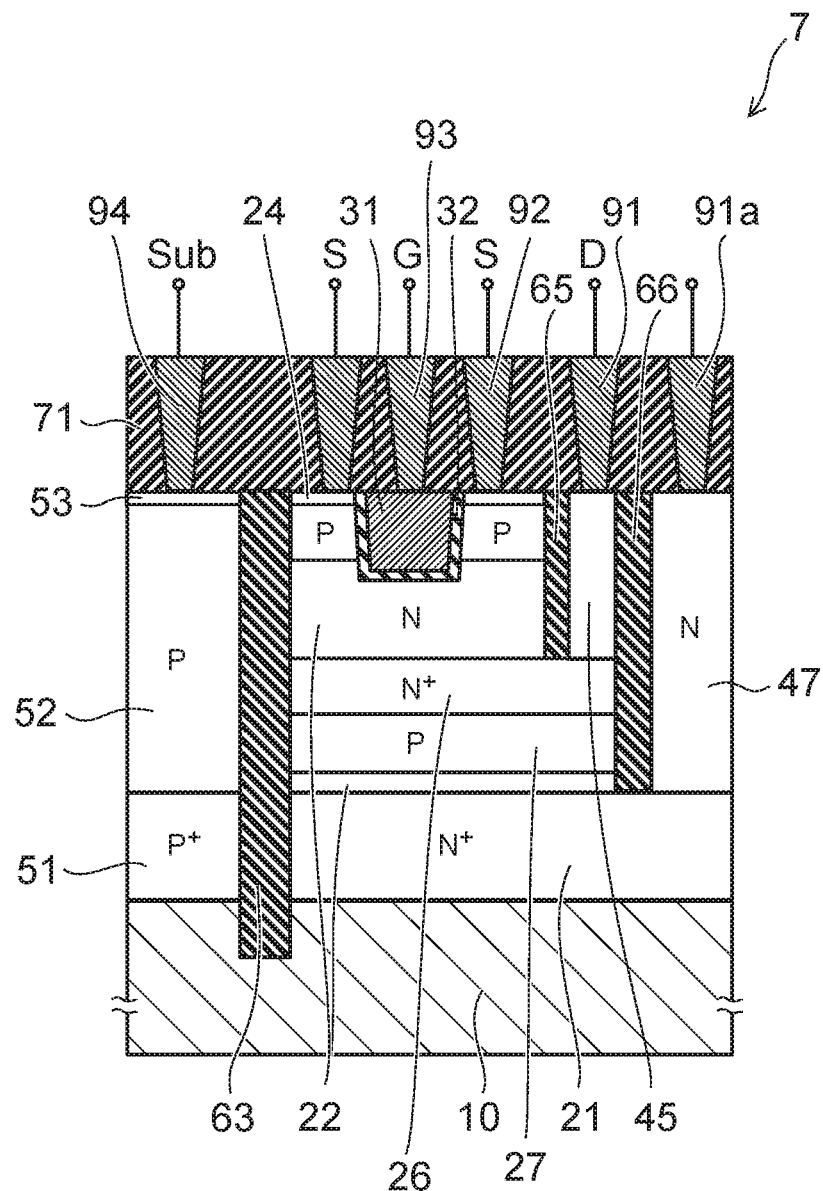

FIG. 7 is a schematic cross-sectional view of a VDMOS 7 of another specific example of the semiconductor device of the second embodiment.

The VDMOS 7 of FIG. 7 further includes a semiconductor region 27 of the P-type, an insulating film 66, and a conductive unit 47 in the structure of the VDMOS 6 of FIG. 6.

The P-type semiconductor region 27 is provided between the drain region 26 and the N$^+$ semiconductor region 21 and contacts the drain region 26. The semiconductor region 27 and the N$^+$ semiconductor region 21 may or may not be in contact. The insulating film 66 extends in the thickness direction of the semiconductor layer from the front surface of the semiconductor layer to the N$^+$ semiconductor region 21. The insulating film 66 extends into the page surface and is provided between the conductive unit 47 and the conductive unit 45 for drain draw-out, between the drain region 26 and the conductive unit 47, and between the P-type semiconductor region 27 and the conductive unit 47. The conductive unit 45 for drain draw-out is provided between the insulating film 65 and the insulating film 66.

The width of the insulating film 66 is wider than the width of the insulating film 65; and the length of the insulating film 66 is longer than the length of the insulating film 65. Here, the length refers to the length in the thickness direction of the semiconductor layer.

The conductive unit 47 is, for example, an N-type semiconductor region and contacts the N$^+$ semiconductor region 21. A contact 91a is provided on the conductive unit 47 in contact with the conductive unit 47.

The potential of the N$^+$ semiconductor region 21 is floating or the ground potential is applied to the N$^+$ semiconductor region 21 via the contact 91a and the conductive unit 47 when a negative potential is input to the drain region 26 via the contact 91 and the conductive unit 45 for drain draw-out in the OFF state of the VDMOS 7 in which, for example, the ground potential is applied to the gate electrode 31.

Therefore, a depletion layer extends from the interface between the P-type semiconductor region 27 and the drift region 22 or from the interface between the P-type semiconductor region 27 and the N$^+$ semiconductor region 21; the drain region 26, the P-type semiconductor region 27, and the substrate 10 are linked by the depletion layer; and the negative input breakdown voltage can be maintained until punch-through.

Figure 8:
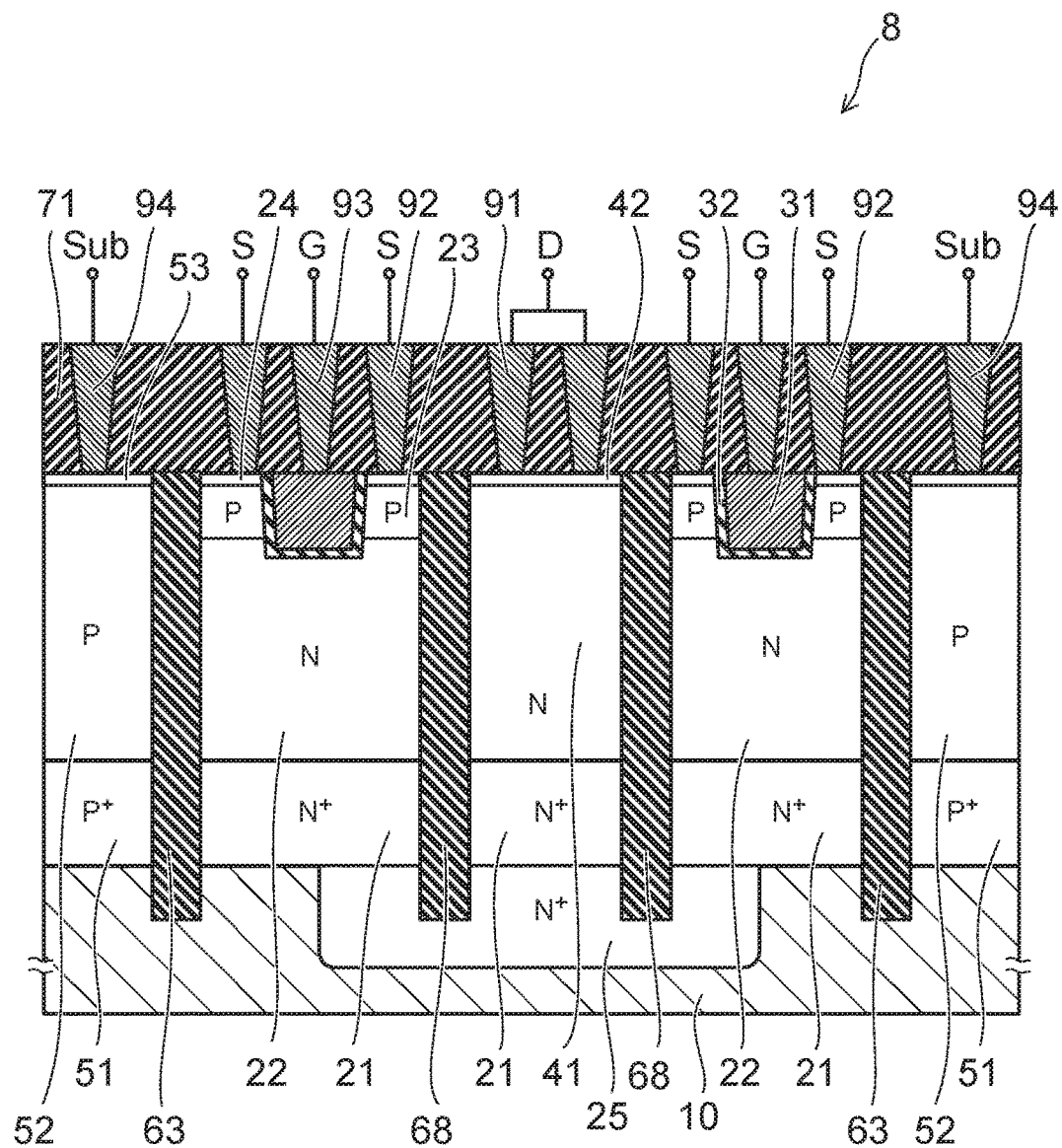
FIG. 8 is a schematic cross-sectional view of a semiconductor device of a third embodiment.

FIG. 8 is a schematic cross-sectional view of a VDMOS 8 of a semiconductor device of a third embodiment. The same components as those of the embodiments described above are marked with the same reference numerals, and a detailed description thereof is omitted.

The VDMOS 8 includes an N-type second drain region (a fifth semiconductor region) 25 provided in the front surface of the substrate 10. The second drain region 25 contacts the first drain region 21 or is provided as one body with the first drain region 21 under the first drain region (the first semiconductor region) 21. The N-type impurity concentration of the second drain region 25 is higher than the N-type impurity concentration of the drift region 22.

The VDMOS 8 includes, for example, the insulating film 63 similar to that of the VDMOS 5 of FIG. 5 described above as the insulating film for element separation.

The VDMOS 8 includes, for example, the substrate draw-out regions 51 and 52 and the contact region 53 similar to those of the VDMOS 5 of FIG. 5 as the conductive unit for substrate draw-out.

The VDMOS 8 includes the N-type drain draw-out region 41 and the N-type contact region 42 as the conductive unit for the drain draw-out. The N-type impurity concentration of the contact region 42 is higher than the N-type impurity concentration of the drain draw-out region 41.

The drain draw-out region 41 is provided on the first drain region 21 in contact with the first drain region 21. The drain draw-out region 41 is connected to the drain contact 91 via the contact region 42.

In the VDMOS 8 as well, similarly to the embodiments described above, the reduction of the element size is realized by providing the conductive unit for drain draw-out to be adjacent, with an insulating film 68 provided inside the element and interposed, to the source region (the fourth semiconductor region) 24, the body region (the third semiconductor region) 23, and the drift region (the second semiconductor region) 22.

The insulating film 68 extends in the thickness direction of the semiconductor layer and extends into the page surface from the front surface of the semiconductor layer to reach the second drain region 25.

The insulating film 68 is provided between the source region 24 and the conductive unit for drain draw-out, between the body region 23 and the conductive unit for drain draw-out, and between the drift region 22 and the conductive unit for drain draw-out.

The insulating film 68 pierces the first drain region 21 and reaches the second drain region 25. The lower end of the insulating film 68 does not pierce the second drain region 25. Accordingly, the path in which the ON current flows is ensured under the lower end of the insulating film 68.

The insulating film 63 and the insulating film 68 have DTI structures and are filled into trenches made simultaneously by RIE in the semiconductor layer as described below.

According to the third embodiment shown in FIG. 8, the ON current path can be ensured inside the drain region merely by adding the impurity implantation process for forming the second drain region 25 under the first drain region 21. The insulating film 68 (the trench) for source-drain separation and the insulating film 63 (the trench) for element separation are formed to the same depth simultaneously inside the element; and it is unnecessary to make two types of trenches having different depths by separate processes. In other words, element size reduction is possible using the insulating film 68 having the DTI structure provided inside the element by a simple process.

Because the bottom of the second drain region 25 is at a position deeper than the bottom of the insulating film 63 for element separation, there is a concern that the drain-substrate breakdown voltage may decrease if the second drain region 25 contacts the insulating film 63 or if the distance between the second drain region 25 and the insulating film 63 is short.

Conversely, according to the third embodiment shown in FIG. 8, the side surface of the second drain region 25 does not contact the insulating film 63 for element separation and is separated from the insulating film 63. In other words, the second drain region 25 is contained inside the region on the inner side of the insulating film 63. Therefore, the breakdown voltage (the drain-substrate breakdown voltage)

between the second drain region 25 and the substrate draw-out region 51 can be ensured.

The second drain region 25 is formed so that the second drain region 25 does not go beyond the insulating film 63 to the outer side of the element region (the substrate draw-out region 51 side) by considering the variation of the formation process of the second drain region 25.

In the VDMOS 8 shown in FIG. 8, as in the VDMOS 1 shown in FIG. 1, the metal region 43 and the semiconductor regions 41 and 42 can be used as the drain draw-out conductive unit.

Also, in the VDMOS 8 shown in FIG. 8, the conductivity type of the semiconductor region of the drain draw-out conductive unit may be provided with a negative input breakdown voltage by being of the P-type as in the VDMOS 2 shown in FIG. 2.

Also, the gate structure of the VDMOS 8 shown in FIG. 8 may have the planar gate structure as in the VDMOS 3 shown in FIG. 3.

Also, in the VDMOS 8 shown in FIG. 8, the field plate electrode 34 may be provided inside the insulating film 68 inside the element as in the VDMOS 4 shown in FIG. 4.

A method for manufacturing the VDMOS of the first embodiment will now be described with reference to FIG. 9A to FIG. 11.

Figure 9A:
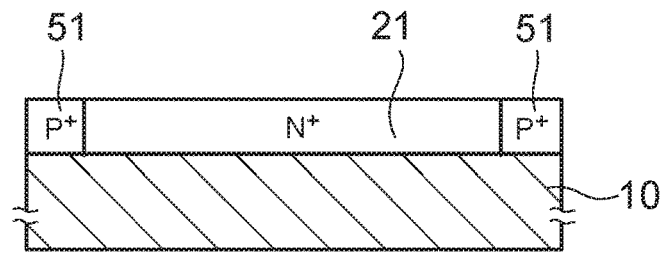
FIGS. 9A to 11 are schematic cross-sectional views showing a method for manufacturing the semiconductor device of the first embodiment.

As shown in FIG. 9A, the N-type drain region 21 and the P-type substrate draw-out region 51 are formed in the front surface of the P-type substrate 10. For example, the drain region 21 is formed in the front surface of the substrate 10 by implanting Sb (antimony), or Sb and P (phosphorus), by ion implantation and by activating by annealing. For example, the substrate draw-out region 51 is formed in the front surface of the substrate 10 by implanting B by ion implantation and by activating by annealing.

Figure 9B:
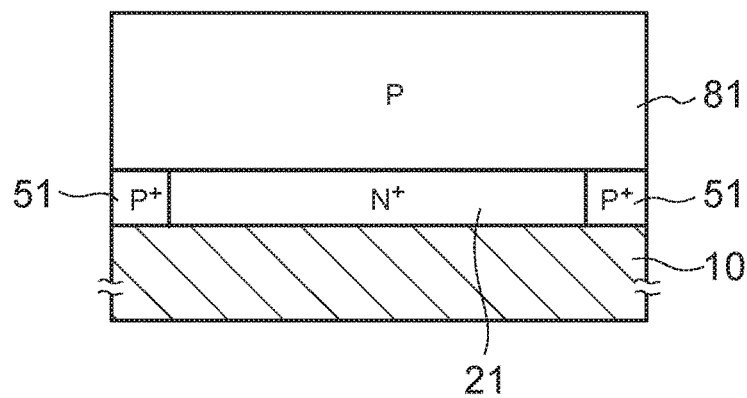

As shown in FIG. 9B, a semiconductor layer 81 is epitaxially grown on the drain region 21 and on the substrate draw-out region 51. The thickness of the semiconductor layer 81 is, for example, 5 to 15 mm. The semiconductor layer 81 may be of the P-type or of the N-type. For example, the P-type semiconductor layer 81 is shown in the drawings. The semiconductor layer 81 may be a N-type semiconductor layer.

Figure 9C:
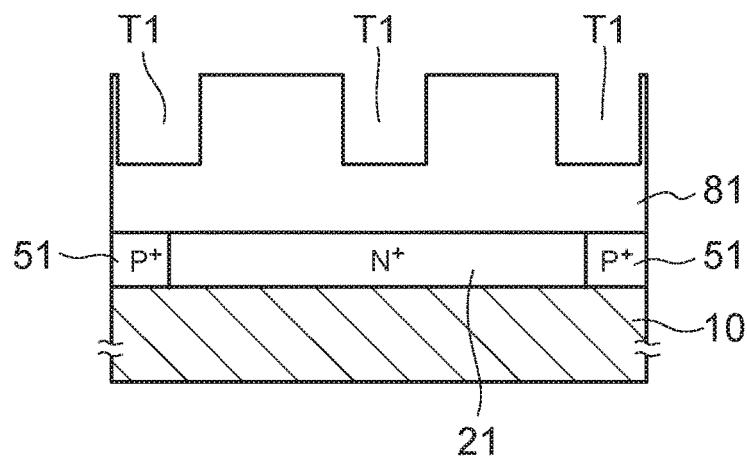

As shown in FIG. 9C, multiple trenches T1 are made in the semiconductor layer 81. For example, the multiple trenches T1 are made simultaneously by RIE using, for example, a not-shown hard mask. The multiple trenches T1 have substantially the same width and substantially the same depth. The depth of the trenches T1 is, for example, 2 to 5 μm; and the trenches T1 do not reach the drain region 21 or the substrate draw-out region 51.

Figure 10A:
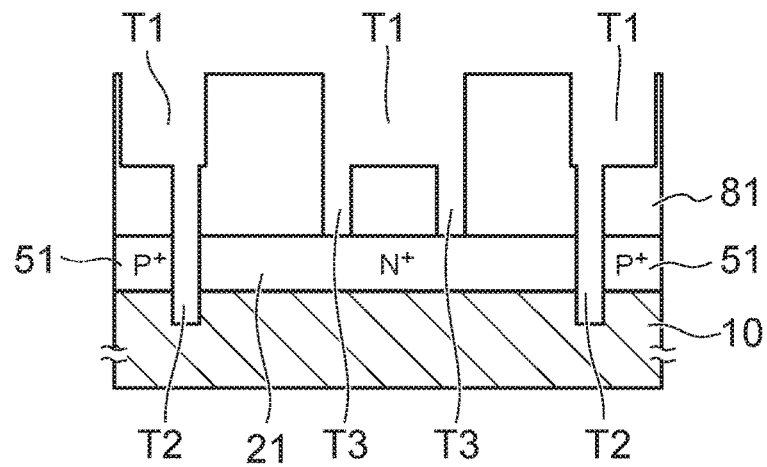

Then, as shown in FIG. 10A, trenches T2 for element separation and trenches T3 that separate the source side and the drain side inside the element are made.

After depositing a not-shown hard mask on the front surface of the semiconductor layer 81, the hard mask is patterned; and the trenches T2 and the trenches T3 are made simultaneously by, for example, RIE using the patterned hard mask.

The trenches T2 and the trenches T3 have substantially the same width and depth (the length in the thickness direction of the semiconductor layer 81). The widths of the trenches T2 and the trenches T3 are narrower than the width of the trenches T1. The depths of the trenches T2 and the trenches T3 are deeper than the depth of the trenches T1.

The trenches T3 are made from the upper surface of the semiconductor layer 81 to reach the drain region 21; and the depth of the trenches T3 is the same as the thickness of the semiconductor layer 81. The upper portions of the trenches T3 communicate with the trenches T1.

The etching of the trenches T2 starts from the bottoms of the trenches T1 and reaches the substrate 10 to divide the drain region 21 and the substrate draw-out region 51.

The two trenches T2 and T3 having different bottom positions can be made simultaneously by setting the etching start positions of the trenches T3 to be the upper surface of the semiconductor layer 81 and by setting the etching start positions of the trenches T2 to be the bottom surfaces of the trenches T1.

An insulating film is filled into the trenches T1, T2, and T3. Subsequently, for example, dry etching of the insulating film is performed by RIE using a not-shown mask.

Figure 10B:
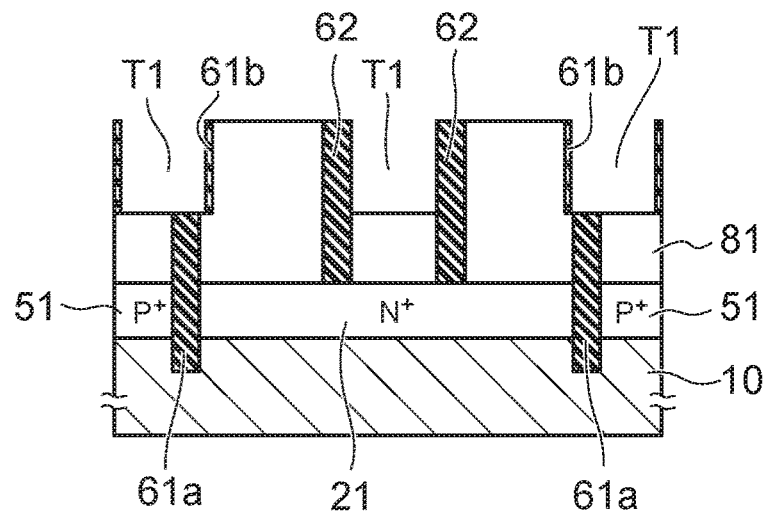

As shown in FIG. 10B, the bottom surfaces of the trenches T1 are exposed by the dry etching. The first portion 61a of the insulating film 61 remains inside the trenches T2. The insulating film 62 remains inside the trenches T3. The second portion 61b of the insulating film 61 remains on the side surfaces of the trenches T1 on the first portion 61a of the insulating film 61.

Figure 10C:
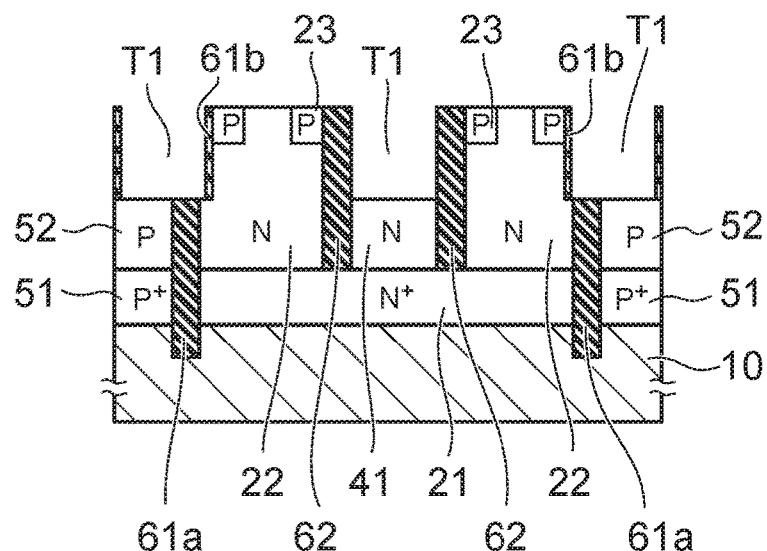

Then, as shown in FIG. 10C, the drift region 22 and the substrate draw-out region 52 are formed in the semiconductor layer 81; and the body region 23 is further formed in the front surface of the drift region 22. The drift region 22 is formed on the drain region 21; and the substrate draw-out region 52 is formed on the substrate draw-out region 51.

Further, the drain draw-out region 41 is formed in the regions under the trenches T1 on the drain region 21. Although the N-type drain draw-out region 41 is shown in the drawings, the P-type drain draw-out region is formed in the case of a device having a negative input breakdown voltage as in the VDMOS 2 of FIG. 2.

The N-type drift region 22 and the N-type drain draw-out region 41 are formed in the semiconductor layer 81 by, for example, implanting P by ion implantation and activating by annealing.

The P-type substrate draw-out region 52 is formed in the semiconductor layer 81 by, for example, implanting B by ion implantation and activating by annealing. The P-type drain draw-out region and the P-type body region 23 also are formed by, for example, ion implantation of B and annealing.

Subsequently, the other components such as the source region 24, the gate electrode 31, the metal regions 43 and 54, etc., shown in FIG. 1 are formed.

For example, after forming the gate electrode 31 on the semiconductor layer with the gate insulator film 32 interposed, the source region 24 is formed by ion implantation and annealing.

The metal regions 43 and 54 are formed by filling, with barrier metals interposed, a metal into the trenches T1.

Figure 11:
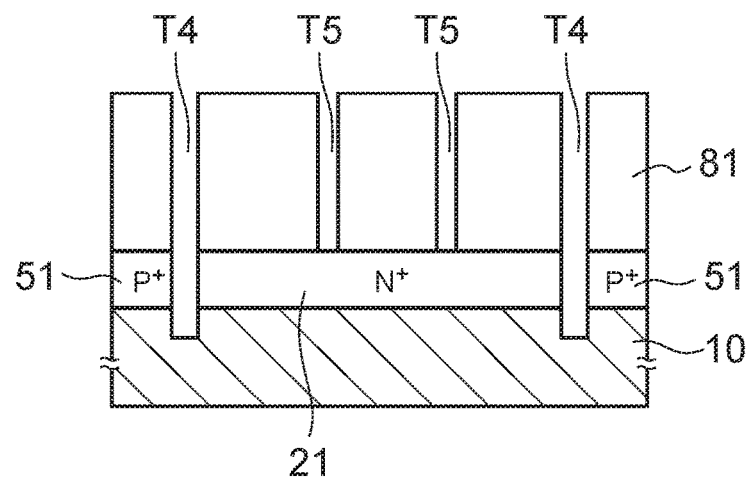

In the case of the VDMOS 5 shown in FIG. 5, trenches T4 and trenches T5 are made in the semiconductor layer 81 as shown in FIG. 11.

For example, the trenches T4 and the trenches T5 are made simultaneously by RIE using a not-shown mask.

The start positions of the etching of the trenches T4 and the trenches T5 both are the upper surface of the semiconductor layer 81; and the etching of the trenches T4 and the trenches T5 is started simultaneously from the same height position. However, because the width of the trenches T4 is wider than the width of the trenches T5, the etching rate is faster for the trenches T4 than for the trenches T5. If the etching is stopped at a timing so that the trenches T5 reach the drain region 21, the trenches T4 reach a position deeper than the trenches T5.

In other words, the trenches T5 do not pierce the drain region 21 and do not reach the substrate 10; but the trenches T4 divide the drain region 21 and the substrate draw-out region 51 and reach the substrate 10.

Thus, the two trenches T4 and T5 having different depths can be made simultaneously by providing the trench T4 and the trench T5 with different widths.

The insulating film 63 for element separation shown in FIG. 5 is filled into the trenches T4. The insulating film 64 that separates the source side and the drain side inside the element is filled into the trenches T5.

By a similar process, the trench for the insulating film 64 of the high breakdown voltage VDMOS 5 shown in FIG. 5 and the trench for the insulating film 65 of the low breakdown voltage VDMOS 6 shown in FIG. 6 that is shallower than the trench of the high breakdown voltage VDMOS 5 can be made simultaneously.

A method for manufacturing the VDMOS 8 of the third embodiment shown in FIG. 8 will now be described with reference to FIG. 12A to FIG. 13B.

Figure 12A:
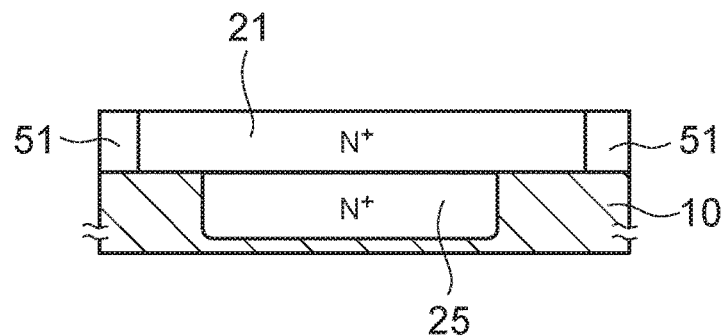
FIGS. 12A to 13B are schematic cross-sectional views showing a method for manufacturing the semiconductor device of the third embodiment.

As shown in FIG. 12A, the N-type first drain region 21 and the P-type substrate draw-out region 51 are formed in the front surface of the P-type substrate 10. The first drain region 21 is formed in the front surface of the substrate 10 by, for example, implanting Sb, or Sb and P, by ion implantation and by activating by annealing. The substrate draw-out region 51 is formed in the front surface of the substrate 10 by, for example, implanting B by ion implantation and by activating by annealing.

Further, the N-type second drain region 25 is formed in the substrate 10 at a position that is deeper than the first drain region 21 by, for example, implanting P by ion implantation and by activating.

Figure 12B:
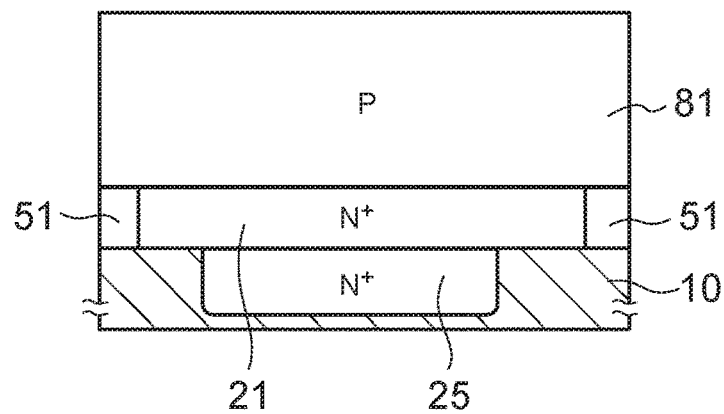

As shown in FIG. 12B, the semiconductor layer 81 is epitaxially grown on the drain region 21 and on the substrate draw-out region 51. The thickness of the semiconductor layer 81 is, for example, 5 to 15 μm. The semiconductor layer 81 may be of the P-type or of the N-type. The P-type semiconductor layer 81 is shown in the drawings.

Figure 13A:
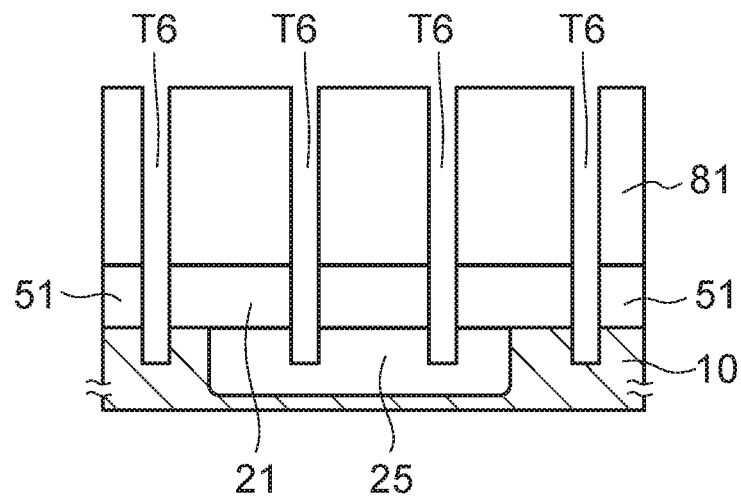

As shown in FIG. 13A, multiple trenches T6 are made in the semiconductor layer 81. For example, the multiple trenches T6 are made simultaneously by RIE using a not-shown mask. The multiple trenches T6 have substantially the same width and substantially the same depth.

The etching of the multiple trenches T6 is started from the upper surface of the semiconductor layer 81 and reaches the same depth.

The trenches T6 in the region where the second drain region 25 is formed pierce the semiconductor layer 81 and the first drain region 21 and reach the second drain region 25. The trenches T6 do not pierce the second drain region 25.

The trenches T6 that are made at positions away from the second drain region 25 reach the substrate 10 to divide the first drain region 21 and the substrate draw-out region 51.

Figure 13B:
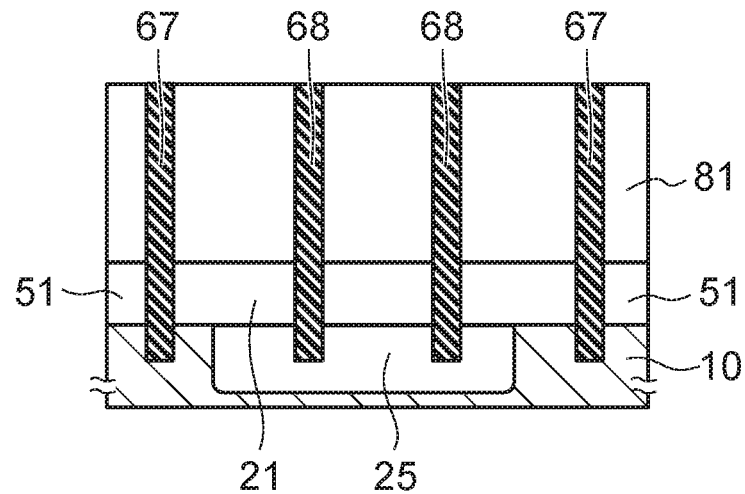

As shown in FIG. 13B, the insulating film 68 is filled into the trenches T6 that reach the second drain region 25. An insulating film 67 is filled into the trenches T6 that are made at the positions away from the second drain region 25.

Subsequently, the other components shown in FIG. 8 are formed.

The conductivity type of the semiconductor layer 81 formed by epitaxial growth in FIG. 9A to FIG. 13B may be of the P-type or of the N-type.

In the case of the P-type semiconductor layer 81, the N-type semiconductor regions such as the drift region 22, etc., are formed by implanting an N-type impurity into the semiconductor layer 81.

In the case of the N-type semiconductor layer 81, the P-type semiconductor regions such as the substrate draw-out region 52, etc., are formed by implanting a P-type impurity into the semiconductor layer 81.

In the embodiments described above, the number of VDMOS elements provided in the element region on the inner side of the element-separating insulating film is an example; and the number is arbitrary.

Figure 14:
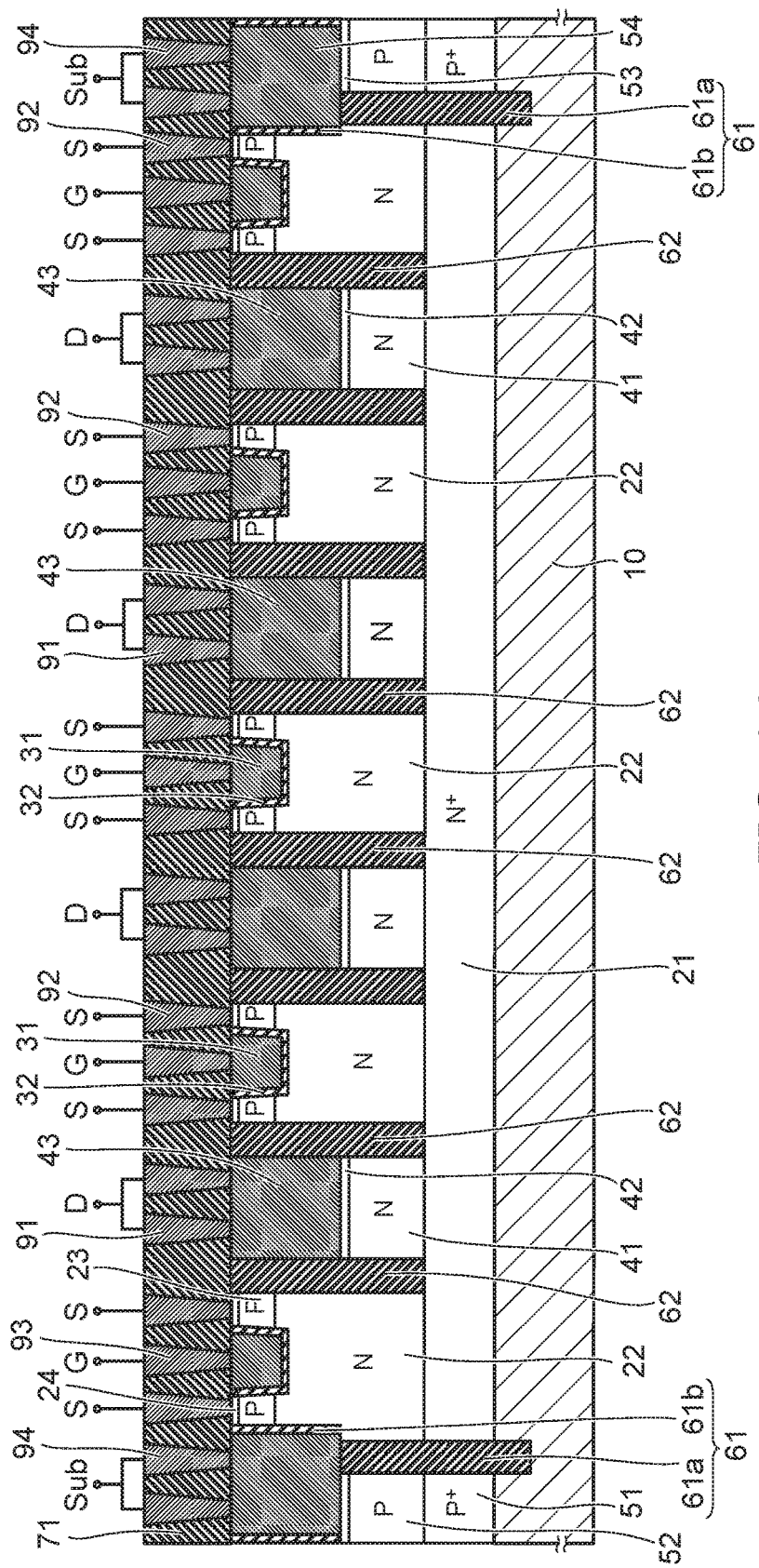
FIG. 14 is a schematic cross-sectional view of the semiconductor device of the first embodiment.

For example, FIG. 14 shows an example in which the number of elements of the VDMOS 1 of the first embodiment is greater than that of FIG. 1. For the other embodiments as well, the number of elements is not limited to the numbers shown in the drawings and is arbitrary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor layer provided on a substrate, the semiconductor layer including a first semiconductor region of a first conductivity type, a second semiconductor region of the first conductivity type, a third semiconductor region of a second conductivity type, and a fourth semiconductor region of the first conductivity type, the first semiconductor region being provided on the substrate, the second semiconductor region being provided on the first semiconductor region, a first conductivity-type impurity concentration being lower in the second semiconductor region than in the first semiconductor region, the third semiconductor region being provided on the second semiconductor region, the fourth semiconductor region being provided in a surface of the third semiconductor region;
   a first conductive unit provided on the first semiconductor region, the first conductive unit including a fifth semiconductor region and a metal region, the fifth semiconductor region contacting the first semiconductor region, the metal region being provided on the fifth semiconductor region;
   a first insulating film extending in a thickness direction of the semiconductor layer from a surface of the fourth semiconductor region to the substrate, the first insulating film being adjacent to the fourth semiconductor region, the third semiconductor region, the second semiconductor region, and the first semiconductor region;
   a second insulating film extending in the thickness direction of the semiconductor layer from the surface of the fourth semiconductor region to the first semiconductor region, the second insulating film being provided between the fourth semiconductor region and the first conductive unit, between the third semiconductor region and the first conductive unit, and between the second semiconductor region and the first conductive unit;
   a gate electrode placed at an opposite side of the third semiconductor region; and
   a gate insulator film provided between the third semiconductor region and the gate electrode.

2. The semiconductor device according to claim 1, wherein a first element and a second element are provided on the same substrate, a conductivity type of the fifth semiconductor region of the first conductive unit in the first element being the first conductivity type, the conductivity type of the fifth semiconductor region of the first conductive unit in the second element being the second conductivity type.

3. The semiconductor device according to claim 1, further comprising a second conductive unit provided on the substrate,
the first insulating film being provided between the second conductive unit and the fourth semiconductor region, between the second conductive unit and the third semiconductor region, between the second conductive unit and the second semiconductor region, and between the second conductive unit and the first semiconductor region.

4. The semiconductor device according to claim 3, wherein the second conductive unit includes a sixth semiconductor region and a metal region, the sixth semiconductor region contacting the substrate, the metal region being provided on the sixth semiconductor region.

5. The semiconductor device according to claim 4, wherein the first insulating film includes a first portion and a second portion, the first portion extending in the thickness direction of the semiconductor layer under the metal region of the second conductive unit, the second portion being provided at a side surface of the metal region of the second conductive unit.

6. The semiconductor device according to claim 1, further comprising an electrode extending in the thickness direction of the semiconductor layer, the electrode opposing the third semiconductor region and the second semiconductor region with the second insulating film interposed.

7. The semiconductor device according to claim 6, wherein the electrode is shorted to the gate electrode or the fourth semiconductor region.

8. The semiconductor device according to claim 1, wherein
a width of the second insulating film is narrower than a width of the first insulating film, and
a length of the second insulating film in the thickness direction of the semiconductor layer is shorter than a length of the first insulating film in the thickness direction of the semiconductor layer.

9. The semiconductor device according to claim 1, wherein the first semiconductor region, the second semiconductor region, the third semiconductor region, the fourth semiconductor region, the second insulating film, and the first conductive unit are provided in a region surrounded with the first insulating film or in a region between a plurality of first insulating films.

10. The semiconductor device according to claim 1, wherein the substrate is of the second conductivity type.

11. A semiconductor device comprising a substrate, a first element provided on the substrate, and a second element provided on the substrate,
the first element including:
a first semiconductor layer provided on the substrate, the first semiconductor layer including a first semiconductor region of a first conductivity type, a second semiconductor region of the first conductivity type, a third semiconductor region of a second conductivity type, and a fourth semiconductor region of the first conductivity type, the first semiconductor region being provided on the substrate, the second semiconductor region being provided on the first semiconductor region, a first conductivity-type impurity concentration being lower in the second semiconductor region than in the first semiconductor region, the third semiconductor region being provided on the second semiconductor region, the fourth semiconductor region being provided in a surface of the third semiconductor region;
a first conductive unit provided on the first semiconductor region of the first element, the first conductive unit contacting the first semiconductor region of the first element;
a first insulating film extending in a thickness direction of the first semiconductor layer from a surface of the fourth semiconductor region of the first element to the first semiconductor region of the first element, the first insulating film being provided between the fourth semiconductor region of the first element and the first conductive unit, between the third semiconductor region of the first element and the first conductive unit, and between the second semiconductor region of the first element and the first conductive unit;
a first gate electrode placed at an opposite side of the third semiconductor region of the first element; and
a first gate insulator film provided between the third semiconductor region of the first element and the first gate electrode,
the second element including:
a second semiconductor layer provided on the substrate, the second semiconductor layer including a first semiconductor region of the first conductivity type, a second semiconductor region of the first conductivity type, a third semiconductor region of the second conductivity type, and a fourth semiconductor region of the first conductivity type, the first semiconductor region being provided on the substrate and separated more from the substrate than the first semiconductor region of the first semiconductor layer, the second semiconductor region being provided on the first semiconductor region, the first conductivity-type impurity concentration being lower in the second semiconductor region than in the first semiconductor region, the third semiconductor region being provided on the second semiconductor region, the fourth semiconductor region being provided in a surface of the third semiconductor region;
a second conductive unit provided on the first semiconductor region of the second element, the second conductive unit contacting the first semiconductor region of the second element;
a second insulating film extending in a thickness direction of the second semiconductor layer from a surface of the fourth semiconductor region of the second element to the first semiconductor region of the second element, the second insulating film being provided between the fourth semiconductor region of the second element and the second conductive unit, between the third semiconductor region of the second element and the second conductive unit, and between the second semiconductor region of the second element and the second conductive unit, a width of the second insulating film being narrower than a width of the first insulating film, a length of the second insulating film in the thickness direction of the second semiconductor layer being shorter than a length of the first insulating film in the thickness direction of the first semiconductor layer;

a second gate electrode placed at an opposite side of the third semiconductor region of the second element; and a second gate insulator film provided between the third semiconductor region of the second element and the second gate electrode.

12. The semiconductor device according to claim 11, wherein the second element further includes
a fifth semiconductor region of the first conductivity type provided between the substrate and the first semiconductor region,
a sixth semiconductor region of the second conductivity type, the sixth semiconductor region being provided between the fifth semiconductor region and the first semiconductor region of the second element, and contacting the first semiconductor region of the second element,
a seventh semiconductor region of the first conductivity type provided on the fifth semiconductor region, and
an electrode provided on the seventh semiconductor region and contacting the seventh semiconductor region.

13. The semiconductor device according to claim 11, further comprising:
a third insulating film extending in the thickness direction of the first semiconductor layer from the surface of the fourth semiconductor region of the first element to the substrate, the third insulating film being adjacent to the fourth semiconductor region of the first element, the third semiconductor region of the first element, the second semiconductor region of the first element, and the first semiconductor region of the first element of the first element; and
a fourth insulating film extending in the thickness direction of the second semiconductor layer from the surface of the fourth semiconductor region of the second element to the substrate, the fourth insulating film being adjacent to the fourth semiconductor region of the second element, the third semiconductor region of the second element, the second semiconductor region of the second element, and the first semiconductor region of the second element.

14. The semiconductor device according to claim 13, wherein
the first element is provided in a region surrounded with the third insulating film or in a region between a plurality of third insulating films, and
the second element is provided in a region surrounded with the fourth insulating film or in a region between a plurality of fourth insulating films.

15. The semiconductor device according to claim 13, wherein
the width of the first insulating film is narrower than a width of the third insulating film,
the length of the first insulating film in the thickness direction of the first semiconductor layer is shorter than a length of the third insulating film in the thickness direction of the first semiconductor layer,
the width of the second insulating film is narrower than a width of the fourth insulating film, and
the length of the second insulating film in the thickness direction of the second semiconductor layer is shorter than a length of the fourth insulating film in the thickness direction of the second semiconductor layer.

16. The semiconductor device according to claim 11, wherein the substrate is of the second conductivity type.

17. A semiconductor device, comprising:
a semiconductor layer provided on a substrate, the semiconductor layer including a first semiconductor region of a first conductivity type, a second semiconductor region of the first conductivity type, a third semiconductor region of a second conductivity type, a fourth semiconductor region of the first conductivity type, and a fifth semiconductor region of the first conductivity type, the first semiconductor region being provided on the substrate, the second semiconductor region being provided on the first semiconductor region, a first conductivity-type impurity concentration being lower in the second semiconductor region than in the first semiconductor region, the third semiconductor region being provided on the second semiconductor region, the fourth semiconductor region being provided in a surface of the third semiconductor region, the fifth semiconductor region being provided between the substrate and the first semiconductor region, the first conductivity-type impurity concentration being higher in the fifth semiconductor region than in the second semiconductor region;
a first conductive unit provided on the first semiconductor region, the first conductive unit contacting the first semiconductor region;
a first insulating film extending in a thickness direction of the semiconductor layer from a surface of the fourth semiconductor region to the substrate, the first insulating film being adjacent to the fourth semiconductor region, the third semiconductor region, the second semiconductor region, and the first semiconductor region;
a second insulating film extending in the thickness direction of the semiconductor layer from the surface of the fourth semiconductor region to the fifth semiconductor region, the second insulating film being provided between the fourth semiconductor region and the first conductive unit, between the third semiconductor region and the first conductive unit, and between the second semiconductor region and the first conductive unit;
a gate electrode placed at an opposite side of the third semiconductor region; and
a gate insulator film provided between the third semiconductor region and the gate electrode.

18. The semiconductor device according to claim 17, wherein the first semiconductor region, the second semiconductor region, the third semiconductor region, the fourth semiconductor region, the fifth semiconductor region, the second insulating film, and the first conductive unit are provided in a region surrounded with the first insulating film or in a region between a plurality of first insulating films.

19. The semiconductor device according to claim 17, wherein a side surface of the fifth semiconductor region is separated from a side surface of the first insulating film.

20. The semiconductor device according to claim 17, wherein the substrate is of the second conductivity type.

* * * * *